June 7, 1966 W. E. DU VALL 3,255,424
ELECTRONIC OSCILLATOR HAVING SATURABLE INDUCTOR MEANS FOR INITIATING OSCILLATIONS
Filed Sept. 17, 1962
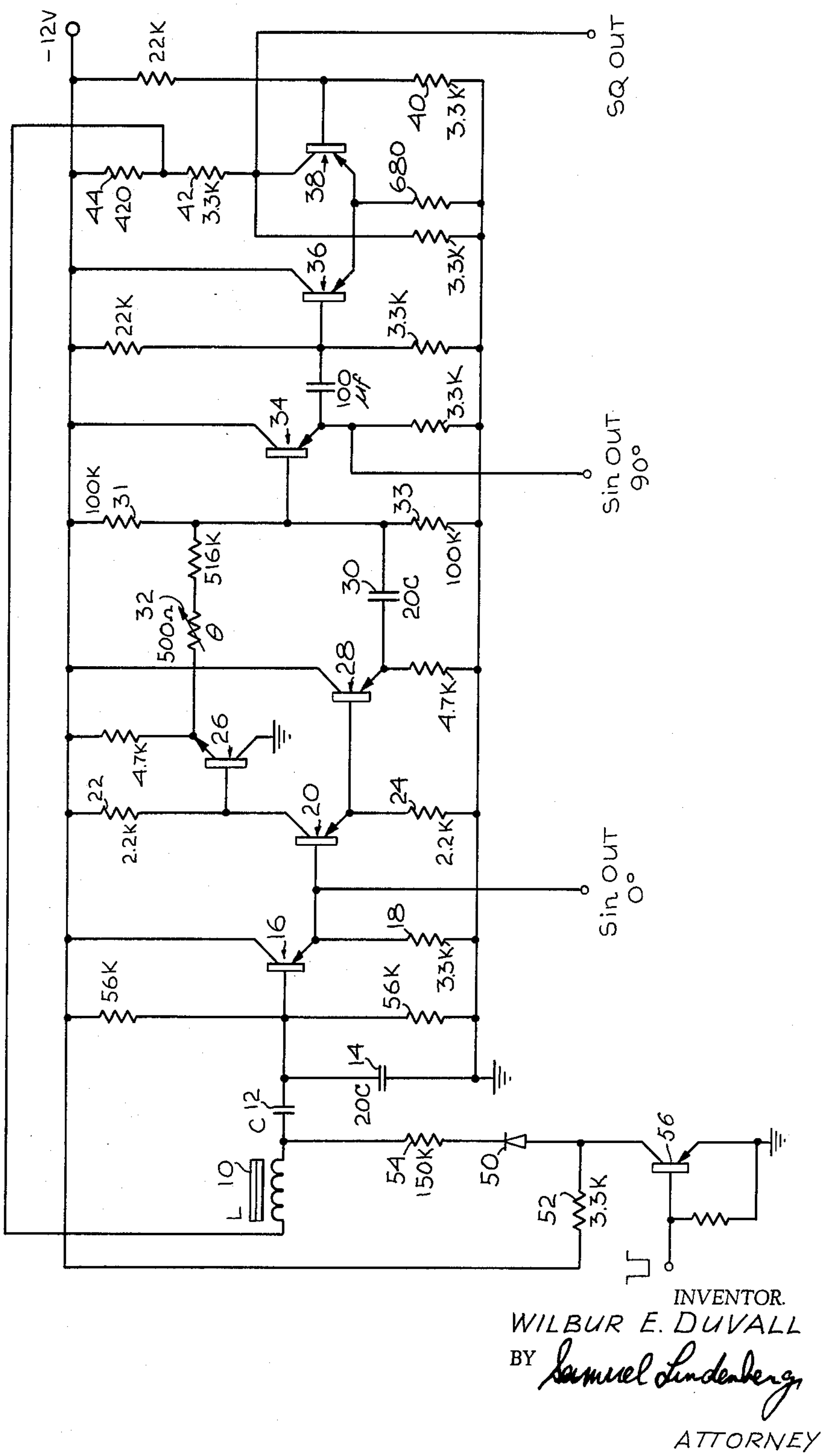
INVENTOR.
WILBUR E. DUVALL
BY Samuel Lindenberg
ATTORNEY 3,255,424

ELECTRONIC OSCILLATOR HAVING SATURABLE INDUCTOR MEANS FOR INITIATING OSCILLATIONS

Wilbur E. Du Vall, Gardena, Calif., assignor, by mesne assignments, to The Electrada Corporation, Los Angeles, Calif., a corporation of Delaware Filed Sept. 17, 1962, Ser. No. 224,140
5 Claims. (Cl. 331—173)

This invention relates to oscillators and more particularly to improvements therein.

There are a great number of oscillator circuits which in response to an input signal will commence oscillations. However, where it is desired to trigger an oscillator from the trailing edge of an incoming pulse, the number of oscillator circuits which would satisfy this requirement is reduced considerably. Where, however, it is desired to trigger an oscillator into oscillating from the leading edge of an incoming pulse, then none of the prior art oscillating circuits are satisfactory. There is always a time lag, or more energy than is provided from the leading edge of the pulse is necessary before the oscillator will commence oscillating.

Accordingly, an object of this invention is to provide an oscillator which can be triggered into oscillating from the leading edge of a pulse signal.

Another object of the present invention is the provision of an oscillator which will start oscillating immediately upon the application of an input signal at full amplitude. Another object of the present invention is the provision of an oscillator which in response to an incoming pulse will immediately start oscillating at full amplitude with full stability.

Still another object of the present invention is the provision of a novel, useful and unique oscillator circuit.

These and other objects of the present invention may be achieved in an arrangement wherein the leading edge of a pulse is applied to the frequency determining circuit of an oscillator which includes an inductance in series with a capacitance. The effect of the incoming pulse is to block the flow of saturating current from a current source through the inductance whereby the oscillator can immediately commence oscillating. The series connected resonance network is connected to the base of a transistor whose output is connected to a phase adjusting network. The phase adjusting network output is then applied to a pulse shaping network the output from which is returned to the series resonance circuit. This oscillator can provide two sign wave outputs which are relatively 90° displaced from one another and also a square wave output.

There is only one figure of the drawing which is a circuit drawing of the embodiment of the invention.

Reference is now made to the drawing which is a circuit diagram of an embodiment of the invention. The circuit, in accordance with this invention, includes an inductance 10 which is connected in series with a capacitance 12. The capacitance 12 has its other side connected to another capacitance 14. The other side of this capacitance 14 is connected to ground. Capacitances 12 and 14 form an impedance dividing network. The impedance of capacitor 12 is selected to have a high value compared to the impedance value of capacitor 14, on the order of 20 to 1 or higher. This is for the purpose of matching the input impedance to a transistor 16 which follows and also in order not to put too great a load upon the series resonant circuit comprised of the inductance 10 and the capacitance 12.

Transistor 16 is emitter follower connected. Its base is connected to the junction of capacitors 12 and 14. Its emitter is connected to ground through a resistor 18 and to the base of a following phase splitting transistor 20. The collector of transistor 16 is connected to an operating potential supply which is on the order of −12 volts. Transistor 20 has a resistor 22 connected between its collector and the operating potential supply. A resistor 24 is connected between its emitter and ground. The values of the resistors 22 and 24 are substantially equal so that the signal which is at the output of the collector and of the emitter are subsantially identical except that they are 180° out of phase.

The collector of transistor 20 is connected to the base of a transistor 26 and the emitter of transistor 20 is connected to the base of a transistor 28. These transistors 26 and 28 merely serve to impedance match the output of the phase splitter transistor 20 into two phase adjusting networks. The phase adjusting networks include a variable resistor 32 and a capacitor 30 which are connected to the junction of series connected resistors 31, 33. The phase adjusting networks serve the purpose of providing the proper phase shift so that when the signal which is fed back into the first transistor 16 has the proper phase to provide oscillation.

The output of the phase adjusting networks are connected together to the base of a transistor 34. This transistor serves as an impedance match between the phase adjusting network and a following amplifying transistor 36 to minimize the load which the impedance networks see. Transistor 34 has its emitter connected through a capacitor to the base of transistor 36 which, as indicated, is an amplifying transistor. The emitter of transistor 36 is connected to the emitter of a transistor 38. Transistor 38 which has its base connected to ground through a resistor 40 also serves to amplify the output received from the impedance matching transistor 34. The collector of transistor 38 is connected to the operating potential supply through two series connected resistors respectively 42, 44. The junction of these two resistors is connected back to the inductance 10.

This oscillator is of the positive feed back type and it commences oscillating at a frequency which is principally established by the series resonance frequency of the inductance 10 and capacitance 12. When the oscillator is oscillating a wave shape is established at the collector of transistor 38 which is substantially rectangular. This occurs because transistor 38 is being overdriven by the sine wave which is received from the transistor 36. The square wave is applied to the inductance 10 which operates to provide as an output to the square wave input a sine wave. It is this sine wave that is applied to the base of the transistor 16.

An output can be taken from the emitter of transistor 16 and also from the emitter of transistor 34. These outputs are sine wave outputs and are relatively 90° out of phase with one another, and have substantially the same voltage amplitudes.

The negative operating potential supply is connected to the anode of a diode 50 to a resistor 52. The diode is connected through a resistor 54 to the junction of the inductance 10 and the capacitor 12. The anode of the diode is also connected to the collector of a transistor 56. When the transistor 56 is not conductive then the supply voltage is applied to the anode of the diode and the diode is thereby back-biased and no current can flow therethrough. The circuit is then in its oscillatory condition. When the transistor 56 is rendered conductive by the leading edge of a negative pulse then the anode of the diode is clamped to ground. It is no longer back-biased and there is a current flow through the diode and through the inductance. This current saturates the iron of the inductance, reducing it to such a low value of inductance that oscillations terminate. The current flow is maintained until such time as the transistor 56 is again rendered non-conductive. The current then stops flowing through the inductance winding. At this time the magnetic field which was established by the current which had been flowing immediately preceding the opening of the switch is collapsed. When this happens the oscillator immediately commences oscillating since this collapsing field induces a voltage in the inductance which is applied across the capacitor 12 to the base of transistor 16.

The frequency of the circuit is principally determined by the values selected for the inductance 10 and the capacitor 12. However, there is a degree of frequency control which may be called a vernier frequency control provided by the variable potentiometer 32. Varying its value can adjust the frequency at which the oscillator will oscillate over a small range. In one application of this oscillator, in place of the variable potentiometer 32, there was provided a transistor which had its impedance changed in response to input signals. In this instance the oscillator was used as an FSK or frequency shift keying oscillator.

Accordingly there has been shown and described herein a novel, useful, oscillator circuit which can be triggered into oscillation immediately in response to an incoming signal such as the leading edge of a pulse. The oscillator provides several useful outputs namely a square wave output and two sign wave outputs which are respectively 90° displaced from one another.

I claim:

1. An electronic oscillator, comprising:
a resonant circuit which includes a saturable inductance and a capacitance having a common junction,
an electronic amplifier having input and output sides connected to said resonant circuit for defining therewith a circuit network capable of sustaining oscillations of a frequency as substantially determined by said resonant circuit,
a diode having two electrodes, one of which is connected to said junction,
a circuit means connected to said diode and said inductance for applying a saturation current through said diode and said inductance thereby driving said inductance into saturation and preventing sustenance of oscillations, said circuit means including
bias control means connected to the other electrode of said diode for selectively permitting and preventing flow of current through said diode.

2. An electronic oscillator, comprising:
a series resonance circuit including a saturable inductance and a capacitor connected in series to said inductance,
an amplifier circuit having input and output sides connected to said series resonance circuit for operating upon said resonance circuit to sustain oscillations as substantially determined by said resonance circuit, said amplifier circuit adjusted to maintain the current and voltage in said inductance below saturation during oscillator operation,
controllable means including a voltage source and a control element connected thereto and defining a terminal, the D.C. potential of which is controlled by the control element to have one of two potentials, coupling means connecting said terminal to the junction of said inductance and said capacitor for applying thereto one of said potentials for developing an electric current driving said inductance into saturation, while decoupling said junction from said terminal when said terminal has the other one of said two potentials.

3. In an oscillator circuit of the type wherein the feedback path includes a saturable inductance and a capacitance,
an oscillation control circuit comprising a source of operating potential having a first and second output terminal,
means connecting one end of said inductance to said first output terminal,
a resistor and a diode connected in series and defining a series-connected circuit network having one end connected to the other end of said inductance,
switch means connected between the other end of said series-connected network and the other terminal of said source of operating potential, said switch means having an unblocked state wherein saturating current can flow therethrough, through said diode and through said inductance whereby said oscillator circuit is blocked from oscillating, and
resistance means connected between said diode and said first output terminal of said source of operating potential, said switch means having a blocked state wherein no current flows therethrough whereby said diode is biased to be non-conducting and said oscillator may oscillate.

4. An oscillator circuit including a series resonant circuit comprising,
a saturable inductance and a capacitance connected in series thereto,
amplifier means having input and output circuits,
a phase shifting network means coupling one end of said series resonant circuit to said input circuit of said amplifier means,
means connecting the output circuit of said amplifier means to the other end of said series resonant circuit so as to define a feedback oscillator circuit,
a source of operating potential,
a diode having one of its electrodes coupled to said inductance,
means connecting said source of operating potential through said diode to said saturable inductance to enable a saturating current to flow through said inductance from said source of operating potential whereby said oscillator circuit is prevented from oscillating, and
bias control means connected to the other electrode of said diode for blocking current flow through said diode to said inductance whereby said oscillating circuit may oscillate.

5. An oscillator comprising a saturable inductance having a first and second end,
a capacitor having a first and second terminal,
means connecting the first terminal of said capacitor to the first end of said inductance,
phase splitting means,
means for coupling the second terminal of said capacitor to said phase splitting means,
means to which the output of said phase splitting means is applied for providing a substantially square wave output in response to output signals furnished by said phase splitting means,
means interconnecting the second end of said inductance and said square wave providing means for applying said substantially square wave output to said inductance,
a source of operating potential, means for connecting said inductance to said source of operating potential to enable a sufficient current flow therethrough to saturate said inductance whereby development of oscillations in said square wave providing means is prevented, and means connected to said connecting means for blocking the flow of current from said source of potential through said inductance to enable development of oscillations therein.

References Cited by the Examiner

UNITED STATES PATENTS

| | | | |
|---|---|---|---|
| 2,942,206 | 6/1960 | Murray ------------ | 331—117 |
| 2,975,408 | 3/1961 | Merel ----------- | 331—117 X |
| 3,146,408 | 8/1964 | Nissim et al. ------ | 331—117 X |

ROY LAKE, *Primary Examiner.*

JOHN KOMINSKI, *Examiner.*

J. B. MULLINS, *Assistant Examiner.*